United States Patent
Liu et al.

(10) Patent No.: US 12,302,538 B2
(45) Date of Patent: May 13, 2025

(54) CONVERTER MODULE AND CONVERTER CABINET

(71) Applicant: Sungrow Power Supply Co., Ltd., Hefei (CN)

(72) Inventors: Jinfeng Liu, Hefei (CN); Jie Zhou, Hefei (CN); Zhi Shen, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 275 days.

(21) Appl. No.: 17/917,534

(22) PCT Filed: May 28, 2021

(86) PCT No.: PCT/CN2021/096667
§ 371 (c)(1),
(2) Date: Oct. 6, 2022

(87) PCT Pub. No.: WO2022/022041
PCT Pub. Date: Feb. 3, 2022

(65) Prior Publication Data
US 2023/0136644 A1 May 4, 2023

(30) Foreign Application Priority Data
Jul. 31, 2020 (CN) .......................... 202021574525.3

(51) Int. Cl.
H05K 7/20 (2006.01)
H02M 7/00 (2006.01)

(52) U.S. Cl.
CPC ............ *H05K 7/209* (2013.01); *H02M 7/003* (2013.01); *H05K 7/20145* (2013.01); *H05K 7/20909* (2013.01)

(58) Field of Classification Search
CPC ........ H02M 7/003; H02M 1/327; H02M 1/32; H05K 7/20409; H05K 5/0217;
(Continued)

(56) References Cited

U.S. PATENT DOCUMENTS 5,424,915 A * 6/1995 Katooka ............ H05K 7/20909
361/695
2005/0115272 A1* 6/2005 Lim ........................ F25D 23/10
62/428
(Continued)

FOREIGN PATENT DOCUMENTS

CN 202364105 U 8/2012
CN 202395676 U 8/2012
(Continued)

OTHER PUBLICATIONS

PCT/CN2021/096667, Jul. 15, 2021, International Search Report and Written Opinion.
(Continued)

*Primary Examiner* — Adam B Dravininkas
(74) *Attorney, Agent, or Firm* — Wolf, Greenfield & Sacks, P.C.

(57) ABSTRACT

A converter module, including a housing and a converter body mounted within the housing. The housing and the converter body are joined to form a cooling channel. A fan is mounted in the cooling channel. An air inlet and an air outlet in communication with the cooling channel are provided on the housing. The cooling channel is distributed at two sides of the converter body. In the converter module described above, the housing and the converter body are joined to form the cooling channel, and the cooling channel at least is distributed at either side of the converter body, thus allowing a cooling airflow to cool the converter body from either side, favoring the implementation of even cooling, and increasing the cooling effect.

8 Claims, 2 Drawing Sheets

(58) Field of Classification Search
CPC ............... H05K 7/20418; H05K 7/209; H05K 7/20909; H05K 7/20918; H05K 7/20145; H05K 7/20136; H05K 7/20436; H02K 9/06; H02K 9/227; H02K 5/18
See application file for complete search history.

(56) References Cited

U.S. PATENT DOCUMENTS

| | | | |
|---|---|---|---|
| 2007/0131220 A1* | 6/2007 | Kim .................... | H05B 6/642 126/273 R |
| 2013/0343110 A1* | 12/2013 | Liu .................... | H05K 7/20909 363/141 |
| 2015/0216075 A1* | 7/2015 | Henkel ................ | H01L 23/467 361/692 |
| 2015/0342087 A1* | 11/2015 | Donth ................ | H05K 7/20145 361/695 |
| 2017/0112020 A1 | 4/2017 | Krivonak et al. | |
| 2017/0152864 A1 | 6/2017 | Lin et al. | |
| 2017/0238445 A1* | 8/2017 | Falk .................... | H02M 7/44 361/694 |
| 2018/0249595 A1* | 8/2018 | Ashbaugh ............ | H05K 7/206 |

FOREIGN PATENT DOCUMENTS

| | | |
|---|---|---|
| CN | 203398979 U | 1/2014 |
| CN | 212970536 U | 4/2021 |
| JP | 2005-164222 A | 6/2005 |

OTHER PUBLICATIONS

International Search Report and Written Opinion for International Application No. PCT/CN2021/096667, mailed Jul. 15, 2021.
Extended European Search Report for European Application No. 21850277.1, dated Jul. 18, 2024.

* cited by examiner

CONVERTER MODULE AND CONVERTER CABINET

This application is a national stage filing under 35 U.S.C. § 371 of International Patent Application Serial No. PCT/CN2021/096667, filed May 28, 2021, which claims priority to Chinese Patent Application No. 202021574525.3, titled "CONVERTER MODULE AND CONVERTER CABINET", filed with the China National Intellectual Property Administration on Jul. 31, 2020. The contents of these applications are the entire disclosure of which is incorporated herein by reference in their entireties.

FIELD

The present application relates to the technical field of machinery industry, and more particularly, to a converter module, and to a converter cabinet applying the converter module.

BACKGROUND

A converter cabinet includes multiple converter modules that are stacked; a bottom of each converter module is respectively provided with a heat dissipation fan and a heat dissipater, which are used to dissipate heat for IGBT (Insulated Gate Bipolar Transistor) of the converter module.

However, in the existing converter cabinet, the heat dissipation fan and the heat dissipater only dissipate heat for the IGBT from the bottom, which cannot achieve uniform heat dissipation, and thus the heat dissipation effect of which is a poor.

In addition, the converter modules are stacked and are in a compact structure, which leads to a gradual increase in the ambient temperature during working, and even the ambient temperature between the two stacked converter modules exceeds a maximum allowable working temperature of the converter modules.

Therefore, a technical problem to be solved urgently by those skilled in the art is to uniformly dissipate heat for a heat source component of the converter module and improve the heat dissipation effect.

SUMMARY

In view of this, a converter module is provided according to the present application, a heat dissipation passage are formed and enclosed by a housing and a converter body of the converter module, and the heat dissipation passage is at least distributed on two sides of the converter body, so that the heat dissipation airflow can simultaneously dissipate heat for the converter body from the at least two sides, which is beneficial to achieving uniform heat dissipation and improving the heat dissipation effect. A converter cabinet is further provided according to the present application, which applies the above converter module and has an excellent heat dissipation effect.

In order to realize the above objects, the following technical solutions are provided according to the present application:

a converter module includes a housing and a converter body that is mounted in the housing; a heat dissipation passage is formed and enclosed by the housing and the converter body, a fan is mounted in the heat dissipation passage; an air inlet and an air outlet, that are in communication with the heat dissipation passage, are provided in the housing; and the heat dissipation passage is at least distributed on two sides of the converter body.

Preferably, in the above converter module, the heat dissipation passage includes:

an upper air duct, located above the converter body;
a lower air duct, located below the converter body; and
a vertical air duct, located on a side surface of the converter body and communicating the upper air duct with the lower air duct;
the air inlet is in communication with the upper air duct, and the air outlet is in communication with the lower air duct.

Preferably, in the above converter module, the upper air duct covers an upper surface of the converter body; the lower air duct covers a lower surface of the converter body; and the vertical air duct covers the side surface of the converter body.

Preferably, in the above converter module, the air inlet and the air outlet are arranged on two adjacent side surfaces of the housing.

Preferably, in the above converter module, a windshield baffle is fixed in the upper air duct, a ventilation hole is provided in the windshield baffle, the upper air duct is divided into a buffer space and a circulation space by the windshield baffle; the buffer space is in communication with the air inlet, and the circulation space is in communication with the vertical air duct.

Preferably, in the above converter module, an air inlet direction of the air inlet is perpendicular to a ventilation direction of the ventilation hole.

Preferably, in the above converter module, an air outlet direction of the air outlet is opposite to the ventilation direction of the ventilation hole.

Preferably, in the above converter module, the fan is fixed in the lower air duct.

Preferably, in the above converter module, a heat dissipater is mounted in the lower air duct; the fan is arranged in the lower air duct at a position which is in communication with the vertical air duct, and is configured to pump an incoming air from the vertical air duct to the heat dissipater, and discharge the incoming air from the air outlet.

A converter cabinet includes multiple stacked converter modules, and each converter module is the converter module according to any one of the above technical solutions.

The converter module is provided according to the present application, which includes the housing and the converter body which is mounted in the housing, the heat dissipation passage is formed and enclosed by the housing and the converter body, the fan is mounted in the heat dissipation passage; the air inlet and the air outlet, which are in communication with the heat dissipation passage, are provided in the housing; and the heat dissipation passage is at least distributed on the two sides of the converter body.

In the converter module provided according to the present application, the heat dissipation passage is formed and enclosed by the housing and the converter body, and the heat dissipation passage is at least distributed on the two sides of the converter body, so that the heat dissipation airflow can simultaneously dissipate heat for the converter body from the at least two sides, which is beneficial to achieving uniform heat dissipation and improving the heat dissipation effect.

The converter cabinet is further provided according to the present application, which applies the above converter module and has an excellent heat dissipation effect.

BRIEF DESCRIPTION OF THE DRAWINGS

For more clearly illustrating embodiments of the present application or technical solutions in the conventional technology, drawings referred to describe the embodiments or the conventional technology will be briefly described hereinafter. Apparently, the drawings in the following description are only some examples of the present application, and for those skilled in the art, other drawings may be obtained based on these drawings without any creative efforts.

Figure 1:
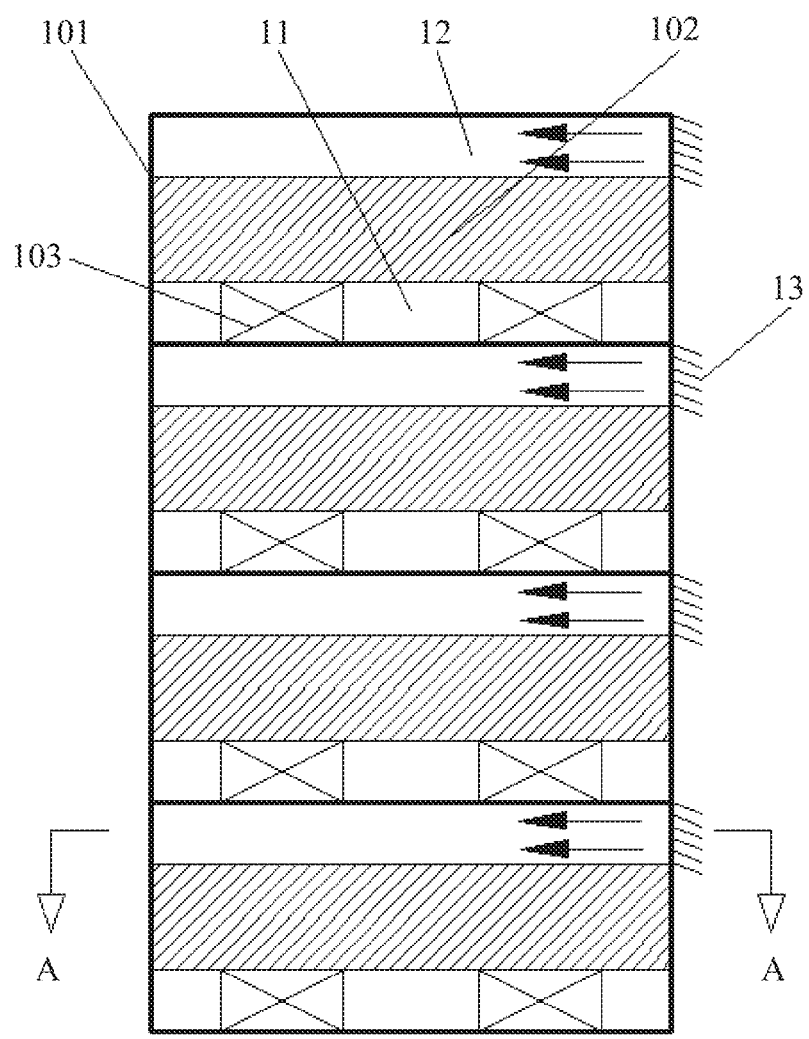
FIG. 1 is a schematic structural view of multiple stacked converter modules according to an embodiment of the present application.
Figure 2:
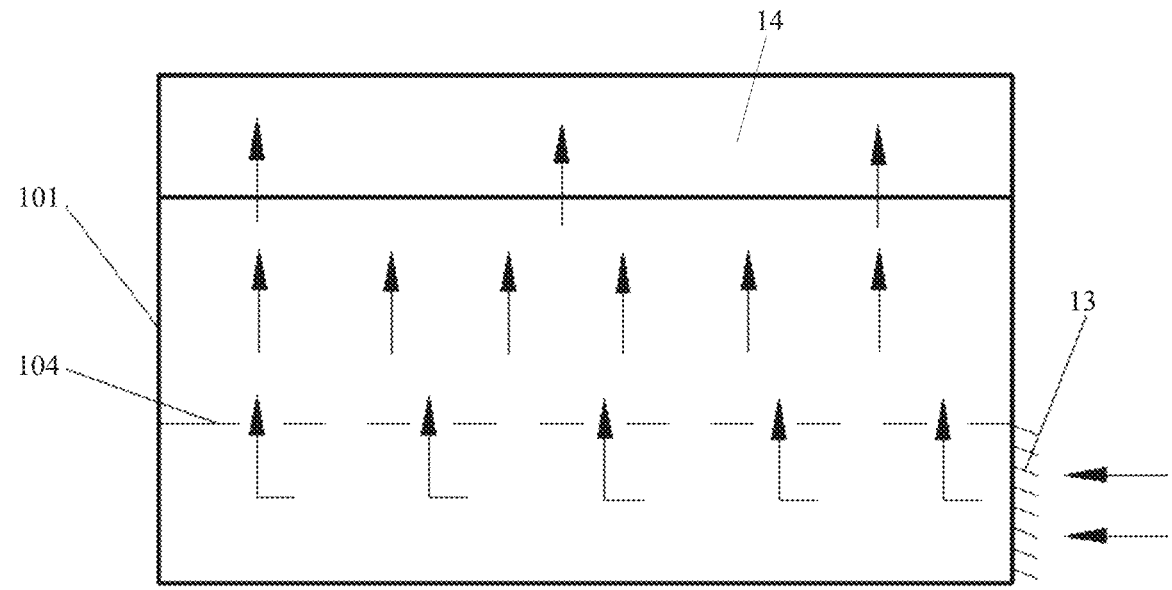
FIG. 2 is a cross-sectional view taken along A-A in FIG. 1.
Figure 3:
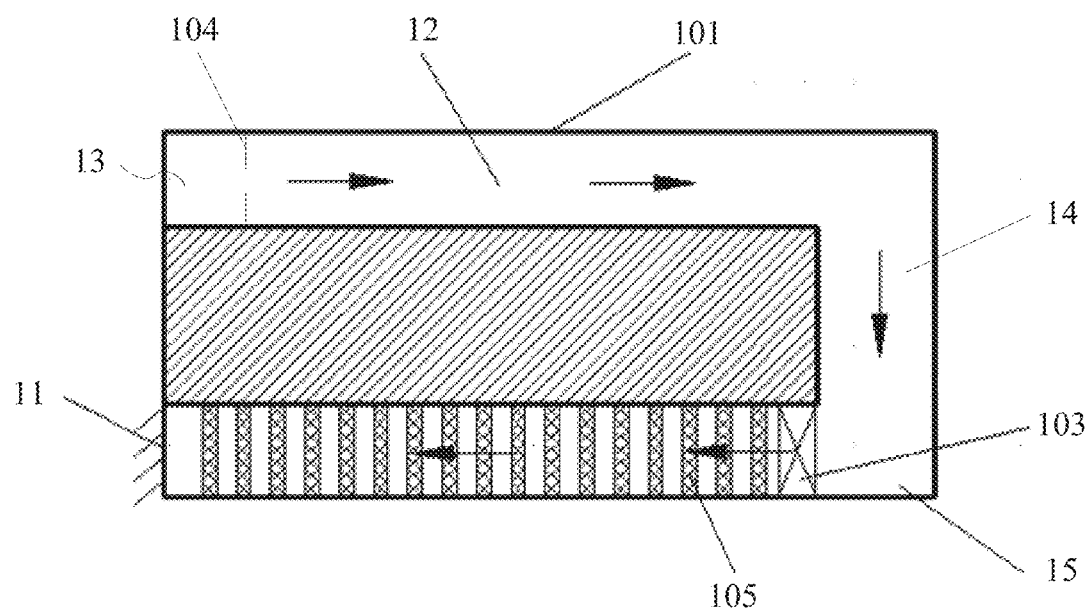
FIG. 3 is a cross-sectional view of the converter module according to the embodiment of the present application.

| Reference numerals in FIGS. 1 to 3: | |
|---|---|
| 101, housing; | 102, inverter body; |
| 103, fan; | 104, windshield baffle; |
| 105, heat dissipater; | 11, air inlet; |
| 12, upper air duct; | 13, air inlet; |
| 14, vertical air duct; | 15, lower air duct. |

DETAILED DESCRIPTION OF THE EMBODIMENTS

A converter module is provided according to an embodiment of the present application, a heat dissipation passage is formed by a housing and a converter body of the converter module, and the heat dissipation passage is at least distributed on two sides of the converter body, so that the heat dissipation airflow can simultaneously dissipate heat for the converter body from the at least two sides, which is beneficial to achieving uniform heat dissipation and improving the heat dissipation effect. A converter cabinet is further provided according to the embodiment of the present application, which applies the above converter module and has an excellent heat dissipation effect.

The technical solutions according to the embodiments of the present application are described clearly and completely as follows in conjunction with the drawings. It is apparent that the described embodiments are only a few rather than all of the embodiments according to the present application. Any other embodiments acquired by those skilled in the art based on the embodiments in the present application without any creative efforts fall within the protection scope of the present application.

Referring to FIGS. 1 to 3, a converter module is provided according to the embodiment of the present application, which includes a housing 101 and a converter body 102 which is mounted in the housing 101. A heat dissipation passage is formed and enclosed by the housing 101 and the converter body 102, a fan 103 is mounted in the heat dissipation passage; an air inlet 13 and an air outlet 11 that are in communication with the heat dissipation passage are provided in the housing 101; and the heat dissipation passage is at least distributed on two sides of the converter body 102.

In the converter module provided in this embodiment, the heat dissipation passage is enclosed by the housing 101 and the converter body 101, and the heat dissipation passage is at least distributed on the two sides of the converter body 102, so that the heat dissipation airflow can simultaneously dissipate heat for the converter body 102 from the at least two sides, which is beneficial to achieving uniform heat dissipation and improving the heat dissipation effect.

In addition, in the above converter module, the heat dissipation passage is arranged on two sides of the converter body 102, so that air at least on two sides of the converter body 102 is in a flowing state, which is beneficial to reducing the ambient temperature around the converter body 102.

Specifically, in the converter module provided in above embodiment, the heat dissipation passage includes an upper air duct 12, a vertical air duct 14 and a lower air duct 15 which are in communication in a listed sequence; the upper air duct 12 is located above the converter body 102; the lower air duct 15 is located below the converter body 102; and the vertical air duct 14 is located on a side surface of the converter body 102 and communicates the upper air duct 12 with the lower air duct 15. The air inlet 13 of the heat dissipation passage is in communication with the upper air duct 12, and the air outlet 11 of the heat dissipation passage is in communication with the lower air duct 15.

In use, the fan 103 in the heat dissipation passage works so as to pump the airflow in the external environment from the air inlet 13 to the upper air duct 12, then the airflow enters the lower air duct 15 from the vertical air duct 14, and finally is discharged from the air outlet 11, such circulation can ensure that the air around the converter body 102 is in the flowing state, which effectively reduces the ambient temperature around the converter body 102, prevents the ambient temperature (especially the ambient temperature between two stacked converter modules) from exceeding a maximum allowable working temperature of the converter modules.

In addition, in the two adjacent upper and lower converter modules, the two converter bodies are separated by the lower air duct 15 and the upper air duct 12, and the distance is increased, which change the impact arrangement in the converter modules of the converter cabinet, and further reduces the ambient temperature.

In order to improve the heat dissipation effect, in the converter module provided in the above embodiment, the upper air duct 12 covers an entire upper surface of the converter body 102; the lower air duct 15 covers an entire lower surface of the converter body 102; and the vertical air duct 14 covers one complete side surface of the converter body 102. The converter body 102 has a rectangular parallelepiped structure, and the housing 101 also has a rectangular parallelepiped structure.

In the converter module provided in the above embodiments, the air inlet 13 and the air outlet 11 of the heat dissipation passage are arranged on two side surfaces of the housing 101, so that the hot air discharged from the air outlet 11 is away from the air inlet 13, so as to prevent the hot air from entering the heat dissipation passage repeatedly and ensure excellent heat dissipation effect.

Furthermore, in the above converter module, a windshield baffle 104 is fixed in the upper air duct 12, multiple ventilation holes are provided in the windshield baffle 104, and the upper air duct 12 is divided into a buffer space and a circulation space by the windshield baffle 104, where the buffer space is in communication with the air inlet 13, and the circulation space is in communication with the vertical air duct 14. The buffer space is in communication with the circulation space through the ventilation holes in the windshield baffle 104.

In the converter module provided in the above embodiments, the airflow first enters the buffer space from the air inlet 13, and then enters the subsequent circulation space through the ventilation holes. The buffer space can make the air entering from the air inlet 13 be even, ensure the uniformity of the flow field in the circulation space, and improve the effect of uniformed heat dissipation. The ventilation holes in the windshield baffle 104 can be configured with different opening sizes as required.

Specifically, in the above converter module, an air inlet direction of the air inlet 13 is perpendicular to a ventilation direction of the ventilation holes, so as to ensure that the airflow enters the buffer space for buffering before entering the circulation space through the ventilation holes, prevent the airflow from the air inlet 13 from directly entering into the ventilation hole without buffering, and fully utilize the buffering effect of the buffer space on the airflow.

An air outlet direction of the air outlet 11 is opposite to the ventilation direction of the ventilation holes, so as to guide the discharged hot airflow away from the air inlet 13. One end, facing away from the windshield baffle 104, of the circulation space is in communication with one end of the vertical air duct 14, and the other end of the vertical air duct 14 is in communication with one end, facing away from the air outlet 11, of the lower air duct 15, that is, the heat dissipation passage is wrapped on an outer circumference of the converter body 102 in a C-shape, as shown in FIG. 3, so as to ensure smooth airflow in the heat dissipation passage, improve the flow efficiency of the airflow, and reduce the energy consumption of the fan 103.

In the above converter module, the fan 103 is fixed in the lower air duct 15. Preferably, a heat dissipater 105 is mounted in the lower air duct 15; the fan 103 is arranged in the lower air duct 15 at a position which is in communication with the vertical air duct 14, and is configured to pump an incoming air from the air inlet 13 through the upper air duct and the vertical air duct 14 to the heat dissipater 105, and discharge the air from the air outlet 11 (that is, the heat dissipater 105 is located between the fan 103 and the air outlet 11). Of course, the fan 103 may be arranged in the vertical air duct 14 or the upper air duct 12, which is not limited herein.

A working principle of the converter module provided in this embodiment is as follows:

the fan 103 pumps air inside the converter module, the air enters the upper air duct 12 from the air inlet 13, the windshield baffle 104 is configured to uniform the air flow field of the upper air duct 12, the air enters the lower air duct 15 along the side surface of the converter module after flowing through the windshield baffle 104, and is finally discharged out of the housing 101, which realizes heat dissipation for the IGBT in the module. With the airflow structure, the entire converter module is surrounded by the air flow field, which reduces the ambient temperature in the housing 101 while dissipating heat for the IGBT, and effectively solves the problem of increased ambient temperature in the housing 101 due to the compact structure. The design of the windshield baffle 104 in the upper air duct 12 can effectively ensure the uniformity of the flow field of the upper air duct 12, thereby ensuring the uniform heat dissipation for the IGBT by the lower air duct 15.

A converter cabinet is further provided according to the embodiment of the present application, which includes multiple stacked converter modules, and each converter cabinet is the converter module provided in the above embodiments.

The converter cabinet is further provided in the embodiment provided applies the above converter module, which can uniformly dissipate heat for the converter body 102 and has an excellent heat dissipation effect. Of course, the converter cabinet provided in the embodiment also has other effects of the converter module provided in the above embodiments, which is not described herein.

The above embodiments are described in a progressive manner. Each of the embodiments is mainly focused on describing its differences from other embodiments, and reference may be made among these embodiments with respect to the same or similar parts.

According to the embodiments disclosed above, a person skilled in the art can implement or use the present application. Various modifications to the embodiments are obvious to the person skilled in the art, and general principles defined in the present application may be implemented in other embodiments without departing from the spirit or scope of the present application. Therefore, the present application shall not be limited to the embodiments described herein but have the widest scope that complies with the principle and novelty disclosed in this specification.

The invention claimed is:

1. A converter module, comprising a housing and a converter body that is mounted in the housing; wherein a heat dissipation passage is formed and enclosed by the housing and the converter body, a fan is mounted in the heat dissipation passage; an air inlet and an air outlet, which are in communication with the heat dissipation passage, are provided in the housing;

wherein the heat dissipation passage is at least distributed on two sides of the converter body; and the heat dissipation passage comprises:

an upper air duct, located above the converter body;

a lower air duct, located below the converter body;

a vertical air duct, located on a side surface of the converter body and communicating the upper air duct with the lower air duct; and wherein the air inlet is in communication with the upper air duct, and the air outlet is in communication with the lower air duct; and the upper air duct covers an upper surface of the converter body, the lower air duct covers a lower surface of the converter body, and the vertical air duct covers the side surface of the converter body.

2. The converter module according to claim 1, wherein the air inlet and the air outlet are arranged on two adjacent side surfaces of the housing.

3. The converter module according to claim 2, wherein a windshield baffle is fixed in the upper air duct, a ventilation hole is provided in the windshield baffle, the upper air duct is divided into a buffer space and a circulation space by the windshield baffle; the buffer space is in communication with the air inlet, and the circulation space is in communication with the vertical air duct.

4. The converter module according to claim 3, wherein an air inlet direction of the air inlet is perpendicular to a ventilation direction of the ventilation hole.

5. The converter module according to claim 4, wherein an air outlet direction of the air outlet is opposite to the ventilation direction of the ventilation hole.

6. The converter module according to claim 1, wherein the fan is fixed in the lower air duct.

7. The converter module according to claim 6, wherein a heat dissipater is mounted in the lower air duct; the fan is arranged in the lower air duct at a position which is in communication with the vertical air duct, and is configured to pump an incoming air from the vertical air duct to the heat dissipater, and discharge the incoming air from the air outlet.

8. A converter cabinet, comprising a plurality of stacked converter modules, wherein each converter module is the converter module according to claim 1.

* * * * *